(12) United States Patent
Chen et al.

(10) Patent No.: US 6,297,133 B1
(45) Date of Patent: Oct. 2, 2001

(54) METHOD OF FABRICATING WELL

(75) Inventors: Jacob Chen; Tz-Guei Jung, both of Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/123,737

(22) Filed: Jul. 28, 1998

(30) Foreign Application Priority Data

May 25, 1998 (TW) .................................................. 87108047

(51) Int. Cl.$^7$ .................................................. H01L 21/265
(52) U.S. Cl. .......................... 438/527; 438/224; 438/228
(58) Field of Search .................................. 438/217, 194, 438/545, 546, 550, 526, 527, 224, 228

(56) References Cited

U.S. PATENT DOCUMENTS

| | | | |
|---|---|---|---|
| 5,108,944 | * | 4/1992 | Shirai ........................................ 437/57 |
| 5,536,665 | * | 7/1996 | Komori ...................................... 437/26 |
| 5,679,588 | * | 10/1997 | Choi ......................................... 437/34 |
| 5,858,812 | * | 1/1999 | Furumiya .................................. 438/76 |
| 5,861,330 | * | 1/1999 | Baker ...................................... 438/232 |
| 5,867,425 | * | 2/1999 | Wong .................................... 365/185.08 |
| 5,895,251 | * | 4/1999 | Kim ........................................ 438/401 |
| 6,037,203 | * | 3/2000 | Kim ........................................ 438/217 |
| 6,127,710 | * | 10/2000 | Choi ....................................... 257/410 |

\* cited by examiner

*Primary Examiner*—Mary Wilczewski
*Assistant Examiner*—David Goodwin
(74) *Attorney, Agent, or Firm*—Thomas, Kayden, Horstemeyer & Risley, LLP

(57) ABSTRACT

A method of manufacturing wells comprises the step of providing a p-type substrate and then sequentially forming a p-well and n-well with low dosage in the p-type substrate. Thereafter, energy is used to dope n-type ions into the p-well. The triple well formed in the present invention has low dosage ions, hence the DRAM formed on the triple well in subsequent process can have a faster refresh time.

14 Claims, 2 Drawing Sheets

METHOD OF FABRICATING WELL

CROSS-REFERENCE TO RELATED APPLICATION

This application claims the priority benefit of Taiwan application Ser. No. 87108047, filed May 25, 1998, the full disclosure of which is incorporated herein by reference.

BACKGROUND OF THE INVENTION

1. Field of the Invention

This invention relates to a method of fabricating semiconductors, and more particularly to a method of fabricating wells.

2. Description of Related Art

The application of the data treatment at present is similar to the typical utilization in microprocessor and digital signal processor, which combine memory cell arrays and high-speed logic circuits on the same chip. For example, a high speed is used to store data into an integrated circuit device, such as a logic circuit, which has a DRAM cell array. This embedded DRAM has large benefits for the integrated circuit, which includes a logic circuit capable of processing large amount of data, such as graphic processor. For the process to combine the high-speed logic circuit and embedded DRAM on the same chip, it is necessary to form the logic circuit and memory cell on the chip.

For the conventional embedded DRAM of the integrated circuit, both the MOS transistor which is used for the DRAM and the MOS transistor which is used for the logic device are formed on the same chip. It has several advantages, such as improvement of the yield, and reducing of cycle time and manufacturing cost.

FIG. 1A to FIG. 1D are cross-sectional views showing a conventional process of fabricating wells. Referring to FIG. 1A, a substrate 10 is provided. The substrate 10 is doped with p-type ions, that is a p-type substrate, is provided, the dosage of p-type ions is about $5E16/cm^3$. Then, a mask 12 is formed to cover part of the substrate 10 and expose another part of the substrate 10. Thereafter, an n-well 14 is formed in the exposed substrate 10 by doping n-type ions, which have a dosage of about $1E17/cm^3$, into the exposed substrate 10.

Referring to FIG. 1B, the mask 12 is removed after the n-well 14 is formed. Then, a mask 16 is formed to cover the surface of the n-well 14 and expose another part of the substrate 10. Thereafter, a p-well 18 is formed in the exposed substrate 10 by doping p-type ions which have a dosage of about $1E17/cm^3$ into the exposed substrate 10.

Referring to FIG. 1C, the mask 16 is removed after the p-well 18 is formed. A mask 20 is formed to cover substrate 10 and partially expose the surface of the n-well 14. Then, a p-well 22, which is a triple well, is formed by doping p-type ions, which have a dosage of about $3E17/cm^3$, into the exposed part of the n-well 14. P-well 22 is formed in the n-well 14 and the p-well 22 is shallow than the n-well 14. That is, three surfaces of the p-well 22 are surrounded by the n-well 14 and one surface of the p-well 22 is exposed.

Referring to FIG. 1D, the mask 20 is removed after the p-well 22 is formed. Then the follow-up process is performed to complete the manufacture of the DRAM above the n-well 14 and the n-channel device above p-well 18. The DRAM and n-channel device are not shown to simplify the figures.

In the conventional method as described above, it is necessary to implant high dosage p-type ions into the n-well 14 to form the triple well. Therefore, the dosage of the triple well is higher than that of the n-well 14. When the DRAM is completed in subsequent processes, the DRAM's refresh time is shortened.

SUMMARY OF THE INVENTION

It is therefore an objective of the present invention to provide a method of manufacturing wells. This method can be used to shorten the refresh time of the DRAM.

In accordance with the foregoing and other objectives of the present invention, the method of manufacturing wells comprises the step of providing a p-type substrate and then sequentially forming a p-well and n-well with low dosage in the p-type substrate, respectively. Thereafter, energy is used to dope n-type ions into the p-well.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

FIG. 2A to FIG. 2D are cross-sectional views showing the process of fabricating wells in accordance with a preferred embodiment of the invention.

Figure 1A:
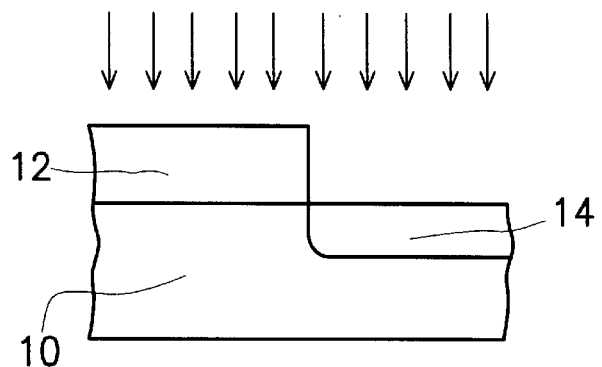
FIG. 1A to FIG. 1D are cross-sectional views showing a conventional process of fabricating wells.
Figure 1B:
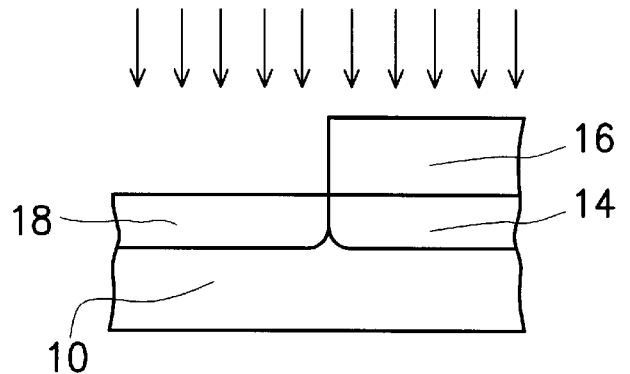
Figure 1C:
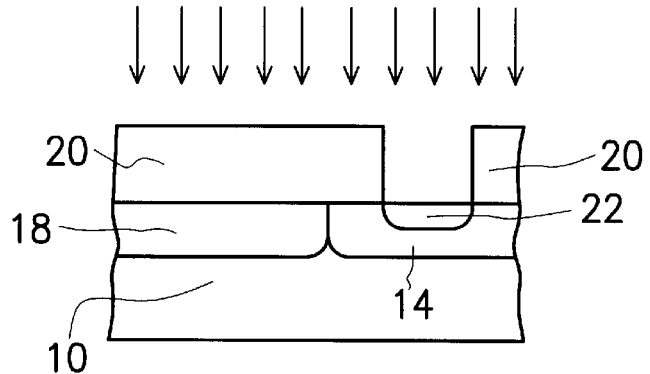
Figure 1D:
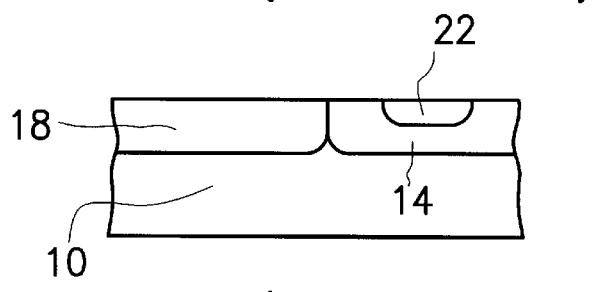
Figure 2A:
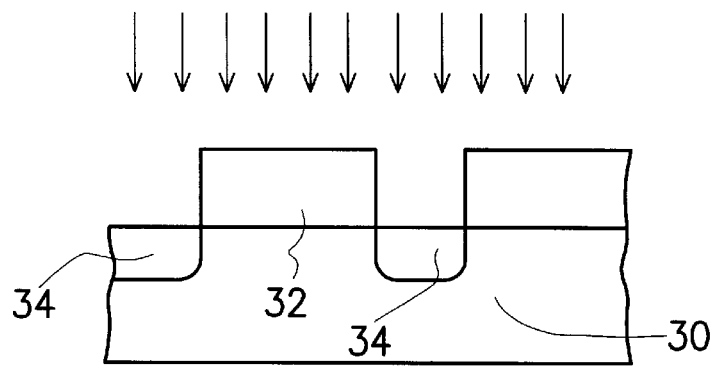
FIG. 2A to FIG. 2D are cross-sectional views showing the process of fabricating wells in accordance with a preferred embodiment of the invention.

Referring to FIG. 2A, a substrate 30 is provided. The substrate 30 is doped with p-type ions, making it a p-type substrate. The dosage of p-type ions is about $5E16/cm^3$. Then, a mask 32 is formed so as to cover one part of the substrate 30 and expose another part of the substrate 30. Thereafter, an n-well 34 is formed in the exposed substrate 30 by doping n-type ions, which have a dosage of about $1E17/cm^3$, into the exposed substrate 30.

Figure 2B:
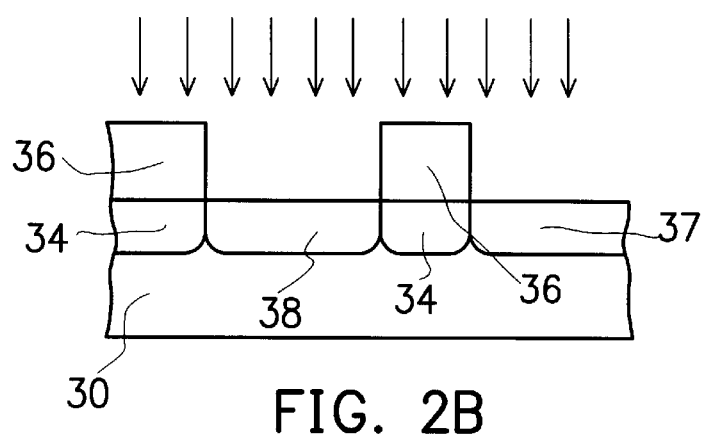

Referring to FIG. 2B, the mask 32 is removed after the n-well 34 is formed. Then, a mask 36 is formed to cover the surface of the n-well 34 and expose another part of the substrate 30. Thereafter, p-wells 38 and 37 are formed in the exposed substrate 30 by doping p-type ions, which have a dosage of about $1E17/cm^3$, into the exposed substrate 30.

Figure 2C:
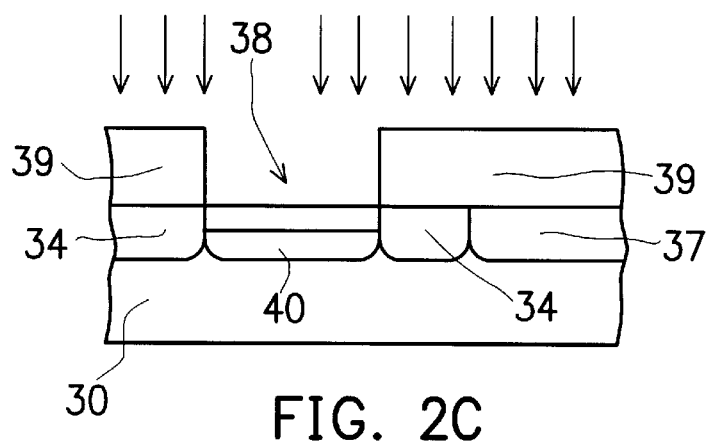

Referring to FIG. 2C, the mask 36 is removed after the p-wells 38 and 37 are formed. A mask 39 is formed to cover substrate 30, which includes covering the p-well 37 and exposing the p-well 38. In subsequent procedure, a DRAM cell is formed on p-well 38 and an n-channel device is formed on p-well 37. Then, energy between 1 MeV and 3 MeV is used to implant n-type ions with a dosage of about $3E17/cm^3$ into p-well 38 so as to form an n-well 40, and making the p-well 38 into a triple well. The n-well 40 is located on the bottom of the p-well 38. That is, the n-well 40 is entirely surrounded by the n-well 34 and the p-well 38.

Figure 2D:
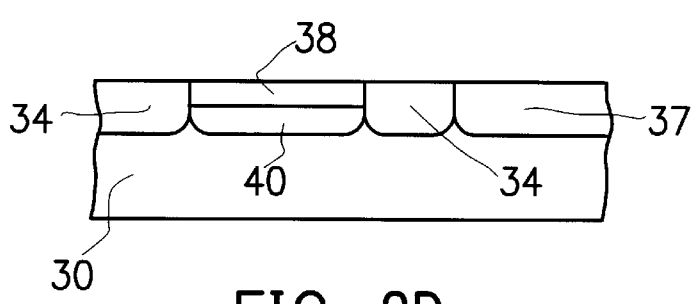

Referring to FIG. 2D, after the n-well 40 is formed, the mask 39 is removed. Then the follow-up process is performed to complete the manufacture of the DRAM above the p-well 38 and the n-channel device above n-well 34. The DRAM and n-channel device are not shown to simplify the figures.

In conclusion, the ions of the p-well 38 have a light dosage, which means that the triple well in the invention has low dosage ions. Therefore, the DRAM formed on the triple well in subsequent process can have a faster refresh time.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method of fabricating wells, comprising:

providing a substrate having a first conductivity type;

forming a first well having a second conductivity type in part of the substrate;

forming a second well having the first conductivity type in another part of the substrate; and forming a third well having the second conductivity type in the bottom of the second well, wherein the second well is a triple well.

2. The method of claim 1, wherein the first conductivity type is p-type.

3. The method of claim 1, wherein the second conductivity type is n-type.

4. The method of claim 1, wherein the step of forming the first well having the second conductivity type further includes implanting ions having the second conductivity type with a first implantation dosage into part of the substrate.

5. The method of claim 1, wherein the step of forming the second well having the first conductivity type further includes implanting ions of the first conductivity type with the first implantation dosage into part of the substrate.

6. The method of claim 1, wherein the step of forming the third well having the second type further includes using an implantation energy to implant second type ions into the part of the substrate.

7. The method of claim 4, wherein the first implantation dosage is about $1E17/cm^3$.

8. The method of claim 6, wherein the implantation energy is between 1 MeV and 3 MeV and an ion implantation dosage is about $3E17/cm^3$.

9. A method of fabricating wells, comprising:

providing a substrate having a first conductivity type implanted with a first ion implantation dosage;

forming a first well having a second conductivity type implanted with a second ion implantation dosage in part of the substrate;

forming a second well having the first conductivity type implanted with the second ion implantation dosage in another part of the substrate; and forming a third well having the second conductivity type implanted with a third ion implantation dosage in the bottom of the second well, wherein the second well is a triple well.

10. The method of claim 9, wherein the first conductivity type is p-type.

11. The method of claim 9, wherein the second conductivity type is n-type.

12. The method of claim 9, wherein the third ion implantation dosage is lower than the second ion implantation dosage.

13. The method of claim 1, wherein three surfaces of the triple well are surrounded by other wells and a fourth surface of the triple well is exposed.

14. The method of claim 9, wherein, three surfaces of the triple well are surrounded by other wells and a fourth surface of the triple well is exposed.

* * * * *